United States Patent [19]

Yi

[11] Patent Number: 5,720,846
[45] Date of Patent: Feb. 24, 1998

[54] CONSTRUCTION OF A CHAMBER CASING IN A PLASMA ETCHING SYSTEM

[75] Inventor: Whikun Yi, Kyungki-do, Rep. of Korea

[73] Assignee: Samsung Electronics Co., Ltd., Suwon, Rep. of Korea

[21] Appl. No.: 780,258

[22] Filed: Jan. 2, 1997

[30] Foreign Application Priority Data

Mar. 19, 1996 [KR] Rep. of Korea ................. 96-7388

[51] Int. Cl.⁶ .................................................. H01L 21/302
[52] U.S. Cl. ................. 156/345; 118/723 I; 315/111.51; 216/68
[58] Field of Search .................. 156/345; 216/68; 118/723 I, 723 IR; 315/111.51

[56] References Cited

U.S. PATENT DOCUMENTS

| | | | |
|---|---|---|---|
| 4,431,901 | 2/1984 | Hull | 219/121 PR |
| 5,521,351 | 5/1996 | Mahoney | 219/121.59 |
| 5,540,800 | 7/1996 | Qian | 156/345 |

FOREIGN PATENT DOCUMENTS 07201811  8/1995  Japan.

Primary Examiner—R. Bruce Breneman
Assistant Examiner—George Goudreau
Attorney, Agent, or Firm—Samsung Electronics Co., Ltd.

[57] ABSTRACT

A plasma etching system is disclosed that minimizes energy loss due to the dissipation of plasma, maintaining high plasma density, and thus increasing ionization efficiency. By this construction, wafers may be etched under low pressure, which reduces the chance of impact applied to the wafers and increases the productivity of the etching system. The construction has a chamber casing having a plasma chamber into which plasma for etching wafers is injected, a reflective film coated on the outer surface of the chamber casing, the reflection film acting to insulate the plasma chamber and prevent the plasma from leaking out of the plasma chamber, and a coil wound around the chamber casing over the reflective film. A predetermined voltage is applied to the coil to generate plasma in the plasma chamber.

5 Claims, 1 Drawing Sheet

CONSTRUCTION OF A CHAMBER CASING IN A PLASMA ETCHING SYSTEM

BACKGROUND OF THE INVENTION

The present invention relates to a plasma etching system used in a process for manufacturing semiconductor devices. More particularly, the present invention relates to a construction in a plasma etching system in which a reflection film is coated on an outer surface of a plasma chamber casing so that the system has an improved ionization efficiency.

FIG. 1 shows a conventional chamber casing of a plasma system used in etching wafers in a process for manufacturing semiconductor devices. As shown in FIG. 1, a coil 2 is wound around an outer surface of a quartz chamber casing 1. When electric power is supplied to the coil 2 by a generator (not shown), the coil 2 generates a magnetic field so that plasma is generated in the chamber formed by the chamber casing 1.

In the conventional plasma system described above, when the interior of the chamber casing 1 is in an excited state, the plasma generated within the chamber casing 1 leaks out through the quartz film of the chamber casing 1. To maintain a proper concentration of plasma, the pressure in the chamber must be remain larger than a certain value while the wafers are etched. Unfortunately, this increased pressure can damage the wafers during etching. In addition, there is an undesirable energy loss resulting from the plasma leaking out of the chamber.

SUMMARY OF THE INVENTION

The present invention has been made to overcome at least the above described problems of the prior art. Accordingly, it is an object of the present invention to provide a construction in a plasma etching system in which a reflective film is coated on an outer surface of a plasma chamber casing to prevent plasma from leaking out of the chamber through the chamber casing, thus providing a system with improved ionization efficiency.

To achieve the above object, the present invention provides a plasma etching system, comprising: a chamber casing having a plasma chamber into which plasma for etching wafers is injected; a reflective film coated on the outer surface of the chamber casing, the reflection film acting to insulate the plasma chamber and prevent the plasma from leaking out of the plasma chamber; and a coil wound around the chamber casing over the reflective film, wherein a predetermined voltage is applied to the coil.

BRIEF DESCRIPTION OF THE DRAWINGS

The above object, along with other features and advantages of the present invention will become more apparent by describing in detail preferred embodiments of the invention with reference to the attached drawings in which.

DETAILED DESCRIPTION OF THE PREFERRED EMBODIMENT

A preferred embodiment of the present invention will now be described in detail with reference to the accompanying drawings.

Figure 1:
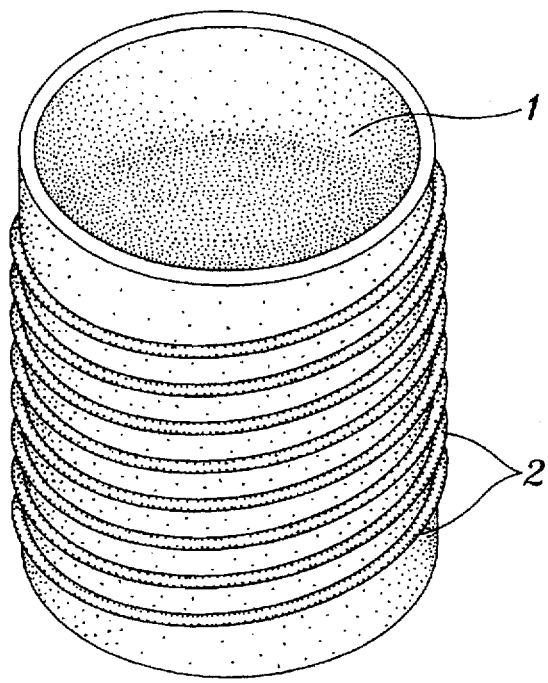
FIG. 1 is a perspective view of a conventional chamber casing of a plasma system used for etching wafers that are used in semiconductor device manufacture.
Figure 2:
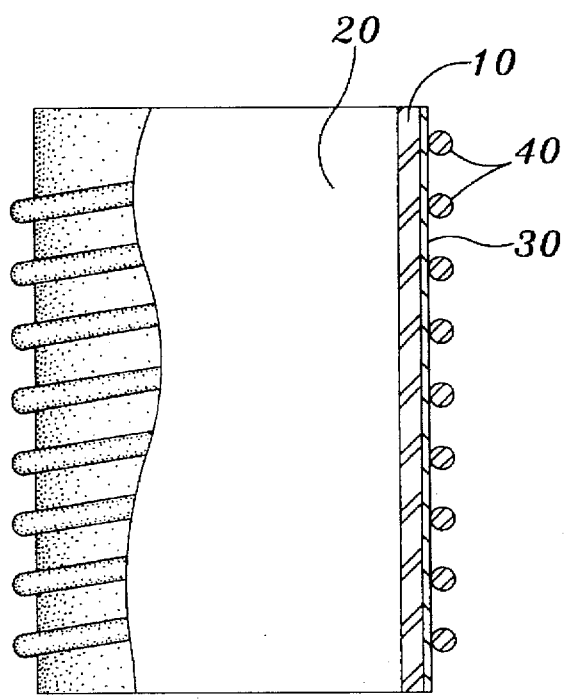
FIG. 2 is a schematic section of a chamber casing of a plasma system according to a preferred embodiment of the present invention.

FIG. 2 is a schematic section of a chamber casing of a plasma system according to a preferred embodiment of the present invention. The chamber casing of FIG. 2 includes an actual chamber casing 10 or casing of the chamber. The chamber casing 10 defines a chamber 20 in which plasma for etching wafers in injected. A reflective film 30 is coated on the outer surface of the casing 10 and prevents the plasma in the chamber 20 from leaking out. The coil 40 is wound around the reflective film 30 coating the chamber casing 10. Electric power is supplied to the coil 40 by a generator (not shown) to create a magnetic field that generates plasma in the plasma chamber 20.

The reflective film is preferably applied to a high density plasma (HDP) system such as an ICP or helicon type. The reflective film 30 preferably comprises aluminum and silver. However, any material that can adequately reflect emissions from the plasma chamber 20 in the visible and ultraviolet range is acceptable.

A process of etching wafers by a plasma system having the construction described above will be described below.

Initially, wafers are placed in the plasma chamber 20. Then, plasma is injected into the plasma chamber 20 while the generator is operated to apply a predetermined voltage to the coil 40. When the voltage is applied to the coil 40 and the electrical potential in the plasma chamber 20 is lowered from an excited state to the ground state, the plasma begins to dissipate from the plasma chamber 20, discharging its excited energy as light and returning to molecules in a lower energy state.

The reflection film 30 coated outside the chamber casing 10 insulates the plasma dissipated out of the chamber by reflecting the emitted light back into the plasma in the plasma chamber 20. This reflected light excites the molecules in the plasma chamber 20, generating additional plasma and reducing the energy loss in the system. This allows the plasma chamber 20 to maintain the high density of the plasma required for the etching process.

According to the present invention, as described above, energy loss due to the dissipation of the plasma is minimized and the ionization efficiency is increased, thus maintaining a high density of plasma. This allows wafers to be etched under low pressure, which reduces the danger of impact applied to the wafers. This in turn increases the productivity of the process.

The present invention is not limited to the above-described embodiments. Various changes and modifications may be effected by one having an ordinary skill in the art and remain within the scope of the invention, as defined by the appended claims.

What is claimed is:

1. A plasma etching system, comprising:
   a chamber casing having a plasma chamber into which plasma for etching wafers is injected;
   a reflective film coated on the outer surface of the chamber casing, the reflection film acting to reflect light back into the plasma chamber; and
   a coil wound around the chamber casing over the reflective film,
   wherein a predetermined voltage is applied to the coil.

2. The plasma etching system of claim 1, wherein the reflective film comprises a metal.

3. The plasma etching system of claim 2, wherein the reflective film comprises aluminum and silver.

4. The plasma etching system of claim 1, wherein the chamber casing is of an ICP or helicon type.

5. The plasma etching system of claim 2, wherein the light reflected by the reflective film includes visible and ultraviolet light.

* * * * *